(12) United States Patent
Kimura et al.

(10) Patent No.: US 12,640,331 B2
(45) Date of Patent: May 26, 2026

(54) MOUNTING SUBSTRATE, BLANKING APERTURE ARRAY CHIP, BLANKING APERTURE ARRAY SYSTEM AND MULTI CHARGED PARTICLE BEAM IRRADIATION APPARATUS

(71) Applicant: NuFlare Technology, Inc., Yokohama (JP)

(72) Inventors: Toshiki Kimura, Yokohama (JP);
Hirofumi Morita, Setagaya-ku (JP);
Takanao Touya, Kawasaki (JP);
Hayato Kimura, Sunto-gun (JP);
Kazuhiro Chiba, Sagamihara (JP)

(73) Assignee: NuFlare Technology, Inc., Yokohama (JP)

( * ) Notice: Subject to any disclaimer, the term of this patent is extended or adjusted under 35 U.S.C. 154(b) by 426 days.

(21) Appl. No.: 18/331,502

(22) Filed: Jun. 8, 2023

(65) Prior Publication Data

US 2024/0013999 A1 Jan. 11, 2024

(30) Foreign Application Priority Data

Jul. 7, 2022 (JP) ................................. 2022-109860
Apr. 21, 2023 (JP) ................................. 2023-070231

(51) Int. Cl.
*H01J 37/04* (2006.01)
*H01J 37/147* (2006.01)
*H01J 37/304* (2006.01)

(52) U.S. Cl.
CPC .......... *H01J 37/045* (2013.01); *H01J 37/147* (2013.01); *H01J 37/304* (2013.01); *H01J 2237/0437* (2013.01)

(58) Field of Classification Search
None
See application file for complete search history.

(56) References Cited

U.S. PATENT DOCUMENTS 3,632,205 A * 1/1972 Marcy ..................... H10P 72/00
355/95
3,930,120 A * 12/1975 Keller ..................... H04N 3/28
348/E3.05
(Continued)

FOREIGN PATENT DOCUMENTS

EP 1033741 A2 * 9/2000 ............. B82Y 40/00
EP 3879557 A1 * 9/2021 ............. H01J 37/09
(Continued)

OTHER PUBLICATIONS

English machine translation for JP-2013165200-A (Year: 2013).*
(Continued)

*Primary Examiner* — Robert H Kim
*Assistant Examiner* — Alina Kaliszewski
(74) *Attorney, Agent, or Firm* — Oblon, McClelland, Maier & Neustadt, L.L.P.

(57) ABSTRACT

According to one embodiment of the present invention, a mounting substrate is installed on a multi charged particle beam irradiation apparatus, and a blanking aperture array chip provided with blanking electrodes to perform blanking deflection on beams in a multi charged particle beam is mounted on the mounting substrate. The mounting substrate includes an opening through which the multi charged particle beam passes, a plurality of control circuits that supply a control signal to the blanking electrodes for each of a plurality of areas into which the blanking aperture array chip is divided, and grounds, each of which is provided for a corresponding one of the plurality of control circuits and configured to supply a ground electrical potential to the corresponding control circuit. The grounds corresponding to the control circuits are electrically separated from each other.

19 Claims, 9 Drawing Sheets

(56) References Cited

U.S. PATENT DOCUMENTS

| | | | | |
|---|---|---|---|---|
| 4,243,866 | A * | 1/1981 | Pfeiffer | H01J 37/147 |
| | | | | 219/121.25 |
| 4,661,709 | A * | 4/1987 | Walker | H01J 37/3177 |
| | | | | 313/325 |
| 5,051,600 | A * | 9/1991 | Schuetz | H01J 37/147 |
| | | | | 250/398 |
| 6,486,479 | B1 | 11/2002 | Oae et al. | |
| 6,753,253 | B1 * | 6/2004 | Takahashi | H10W 46/00 |
| | | | | 257/E23.114 |
| 6,903,353 | B2 * | 6/2005 | Muraki | B82Y 10/00 |
| | | | | 250/492.22 |
| 10,483,080 | B1 * | 11/2019 | Cook | H01J 37/147 |
| 10,622,184 | B2 * | 4/2020 | Knippelmeyer | H01J 37/20 |
| 2004/0046125 | A1 * | 3/2004 | Chen | H01J 37/141 |
| | | | | 250/397 |
| 2004/0104353 | A1 * | 6/2004 | Berglund | H01J 37/3177 |
| | | | | 250/310 |
| 2004/0169147 | A1 * | 9/2004 | Ono | H01J 37/3177 |
| | | | | 250/396 R |
| 2004/0188630 | A1 * | 9/2004 | Brunner | H01J 37/153 |
| | | | | 250/396 R |
| 2005/0287800 | A1 * | 12/2005 | Katase | H10W 20/0698 |
| | | | | 257/E21.59 |
| 2015/0129763 | A1 * | 5/2015 | Ominami | H01J 37/147 |
| | | | | 250/310 |
| 2016/0064179 | A1 * | 3/2016 | Yamashita | H01J 37/045 |
| | | | | 250/505.1 |
| 2016/0093470 | A1 * | 3/2016 | Kagarice | H01J 37/05 |
| | | | | 250/311 |
| 2016/0099129 | A1 * | 4/2016 | Yamashita | H01J 37/045 |
| | | | | 250/396 R |
| 2016/0111246 | A1 * | 4/2016 | Matsumoto | H01J 37/3177 |
| | | | | 250/396 R |
| 2016/0141142 | A1 * | 5/2016 | Matsumoto | H01J 37/3177 |
| | | | | 250/398 |
| 2017/0345612 | A1 * | 11/2017 | Touya | H01J 37/045 |
| 2018/0166248 | A1 | 6/2018 | Ogasawara | |
| 2018/0182593 | A1 * | 6/2018 | Matsumoto | H01J 37/09 |
| 2018/0226219 | A1 * | 8/2018 | Haynes | H01J 37/285 |
| 2020/0091056 | A1 * | 3/2020 | Okada | H01L 23/49838 |
| 2020/0176216 | A1 * | 6/2020 | Inoue | H01J 37/20 |
| 2020/0258716 | A1 * | 8/2020 | Matsumoto | H01J 37/3177 |
| 2020/0317504 | A1 * | 10/2020 | Wang | B81B 3/00 |
| 2022/0399181 | A1 * | 12/2022 | Kimura | H01J 37/045 |
| 2023/0010272 | A1 * | 1/2023 | Murakami | H01J 37/045 |
| 2023/0041174 | A1 * | 2/2023 | Wang | H01J 37/04 |

FOREIGN PATENT DOCUMENTS

| | | | | |
|---|---|---|---|---|
| JP | 11-177274 A | 7/1999 | | |
| JP | 2000164495 A * | 6/2000 | | |
| JP | 2001-320137 A | 11/2001 | | |
| JP | 2006019439 A * | 1/2006 | | H01J 37/045 |
| JP | 2006-32595 A | 2/2006 | | |
| JP | 2010074046 A * | 4/2010 | | |
| JP | 2013165200 A * | 8/2013 | | |
| JP | 2018098269 A * | 6/2018 | | |
| JP | 2019204898 A * | 11/2019 | | |
| JP | 2021077802 A * | 5/2021 | | |
| JP | 7110831 B2 * | 8/2022 | | |
| KR | 10-2004-0066450 A | 7/2004 | | |
| KR | 10-2009-0093076 A | 9/2009 | | |
| KR | 10-2012-0035015 A | 4/2012 | | |
| TW | 201721698 A * | 6/2017 | | H01J 37/3177 |
| WO | WO-2009043824 A2 * | 4/2009 | | H01J 37/14 |
| WO | WO-2015191105 A1 * | 12/2015 | | H10W 20/081 |

OTHER PUBLICATIONS

English machine translation for JP-2000164495-A (Year: 2000).*

English machine translation for JP-2006019439-A (Year: 2006).*

Letzkus, Florian & Butschke, Joerg & Irmscher, Mathias & Jurisch, Michael & Klingler, Wolfram & Platzgummer, Elmar & Klein, Christof & Loeschner, Hans & Springer, Reinhard. (2009). Deflection Unit for Multi-Beam Mask Making. 7122. 1-12. 10.1117/12. 801401. (Year: 2009).*

Letzkus, Florian & Irmscher, Mathias & Jurisch, Michael & Platzgummer, Elmar & Klein, Christof & Loeschner, Hans. (2009). 3D Si aperture-plates combined with programmable blanking-plates for multi-beam mask writing. Proc SPIE. 7488. 10.1117/12.829630. (Year: 2009).*

English machine translation for WO-2009043824-A2 (Year: 2009).*

English machine translation for JP-2010074046-A (Year: 2010).*

English machine translation for TW-201721698-A (Year: 2017).*

English machine translation for JP-2018098269-A (Year: 2018).*

English machine translation for JP-2019204898-A (Year: 2019).*

English machine translation for JP-2021077802-A (Year: 2021).*

English machine translation for JP-7110831-B2 (Year: 2022).*

Korean Office Action issued Dec. 10, 2024 in Korean Patent Application No. 10-2023-0070776 (with unedited computer-generated English Translation), 11 pages.

Korean Office Action issued Aug. 25, 2025 in Korean Patent Application No. 10-2023-0070776 (with unedited computer- generated English translation), 15 pages.

* cited by examiner

MOUNTING SUBSTRATE, BLANKING APERTURE ARRAY CHIP, BLANKING APERTURE ARRAY SYSTEM AND MULTI CHARGED PARTICLE BEAM IRRADIATION APPARATUS

CROSS REFERENCE TO RELATED APPLICATION

This application is based upon and claims benefit of priority from the Japanese Patent Application No. 2022-109860, filed on Jul. 7, 2022, and the Japanese Patent Application No. 2023-070231, filed on Apr. 21, 2023, the entire contents of which are incorporated herein by reference.

FIELD

The present invention relates to a mounting substrate, a blanking aperture array chip, a blanking aperture array system and a multi charged particle beam irradiation apparatus.

BACKGROUND

With high integration of LSI, the circuit line width of semiconductor devices has been further miniaturized. An electron beam writing technique with a superior resolution is used as a method of forming an exposure mask (the one used in a stepper or a scanner is also called a reticle) for forming a circuit pattern on these semiconductor devices.

As electron beam writing apparatuses, writing apparatuses using a multi-beam are being developed. As compared to when a single electron beam is used for writing, more beams can be radiated using a multi-beam, thus the throughput can be significantly improved. In a multi-beam writing apparatus, a multi-beam is formed, for example, by passing an electron beam discharged from an electron gun through an aperture substrate having a plurality of openings, blanking control is performed on each beam by a blanking aperture array chip, and those beams that are not shielded are reduced by an optical system, and radiated to a substrate placed on a movable stage.

The blanking aperture array chip has a plurality of openings. Each of the openings is provided with a blanker (electrode pair) that performs blanking control on a beam, and a control signal for switching between ON and OFF of the beam is given to each blanker. Thus, a control circuit with current paths arranged in a complicated manner is incorporated in a mounting substrate on which the blanking aperture array chip is mounted.

There was a problem in the past that the position of an electron beam varies due to the effect of a magnetic field generated by a current which flows through the control circuit.

DETAILED DESCRIPTION

According to one embodiment of the present invention, a mounting substrate is installed on a multi charged particle beam irradiation apparatus, and a blanking aperture array chip provided with blanking electrodes to perform blanking deflection on beams in a multi charged particle beam is mounted on the mounting substrate. The mounting substrate includes an opening through which the multi charged particle beam passes, a plurality of control circuits that supply a control signal to the blanking electrodes for each of a plurality of areas into which the blanking aperture array chip is divided, and grounds, each of which is provided for a corresponding one of the plurality of control circuits and configured to supply a ground electrical potential to the corresponding control circuit. The grounds corresponding to the control circuits are electrically separated from each other.

Hereinafter, an embodiment of the present invention will be described with reference to the drawings. In this embodiment, a configuration using an electron beam as an example of a charged particle beam will be described. However, the charged particle beam is not limited to the electron beam, and may be another charged particle beam such as an ion beam.

Figure 1:
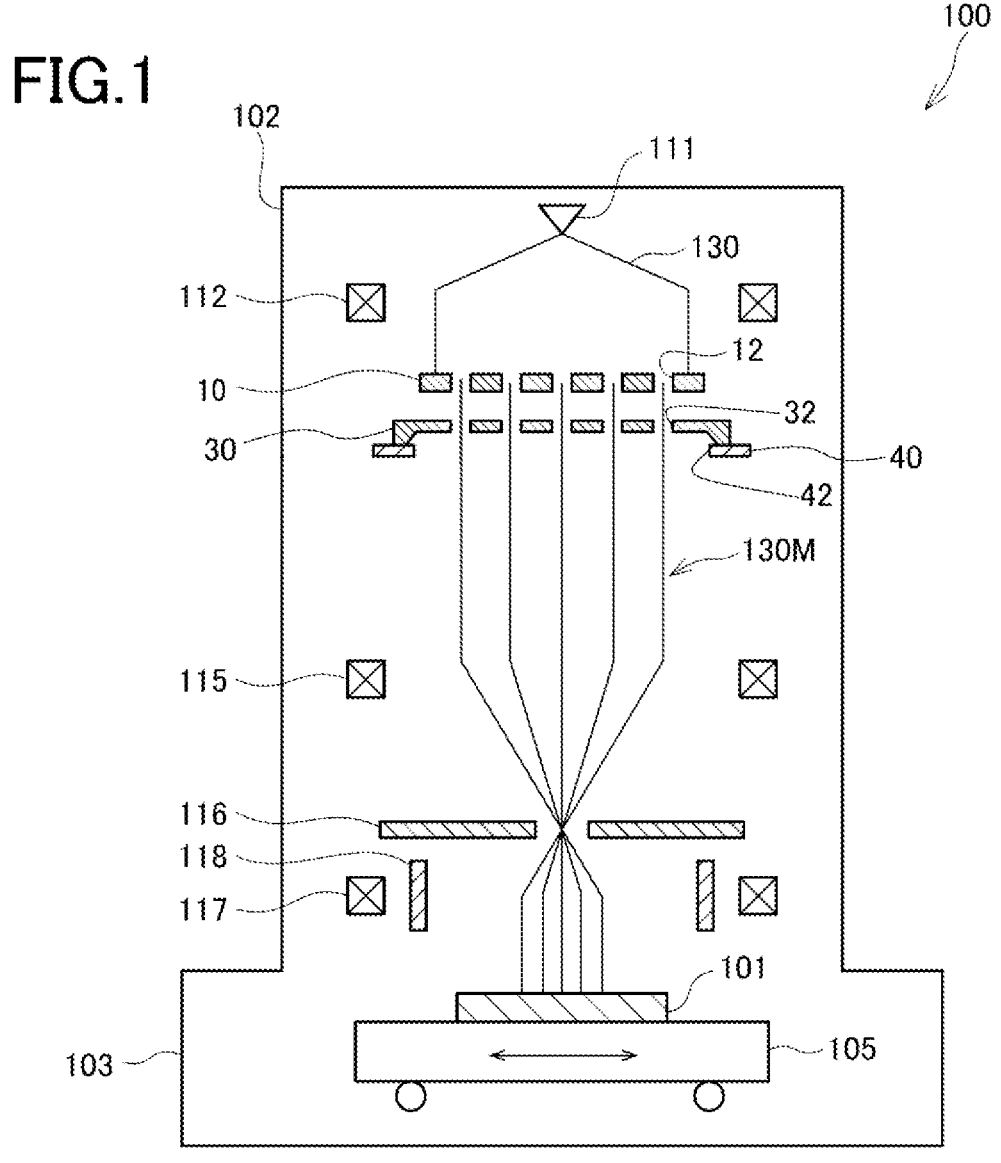
FIG. 1 is a schematic view of a multi charged particle beam writing apparatus according to an embodiment of the present invention.

FIG. 1 is a schematic view of a writing apparatus according to an embodiment. A writing apparatus 100 illustrated in FIG. 1 is an example of a multi charged particle beam writing apparatus. The writing apparatus 100 includes an electron column 102 and a writing chamber 103. In the electron column 102, an electron gun 111, an illumination lens 112, a shaping aperture array substrate 10, a blanking aperture array chip 30, a reduction lens 115, a limiting aperture member 116, an objective lens 117 and a deflector 118 are disposed.

Figure 3:
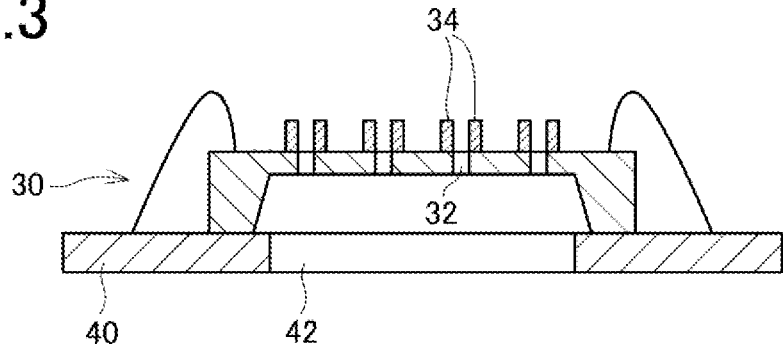
FIG. 3 is a schematic configuration view of a mounting substrate and a blanking aperture array chip.

The blanking aperture array chip (BAA chip) 30 is mounted (installed) on the mounting substrate 40, and those are electrically coupled by flip chip bonding or wire bonding (see FIG. 3). An opening 42 (see FIG. 1, FIG. 3, FIG. 4) for passing an electron beam (multi-beam 130M) is formed in the central portion of the mounting substrate 40. The BAA chip 30 is mounted to be positioned above the opening 42. When installing the mounting substrate 40 on which the BAA chip 30 is mounted in the electron column 102, the BAA chip 30 may be installed looking toward upper side or bottom side.

In the writing chamber 103, an XY stage 105 is disposed. At the time of writing, a sample 101, such as a mask, serving as a writing target substrate is disposed on the XY stage 105. The sample 101 includes an exposure mask at the time of manufacturing a semiconductor device, or a semiconductor substrate (silicon wafer) on which a semiconductor device is manufactured. In addition, the sample 101 includes a mask blank which is coated with resist and on which nothing has been written.

Figure 2:
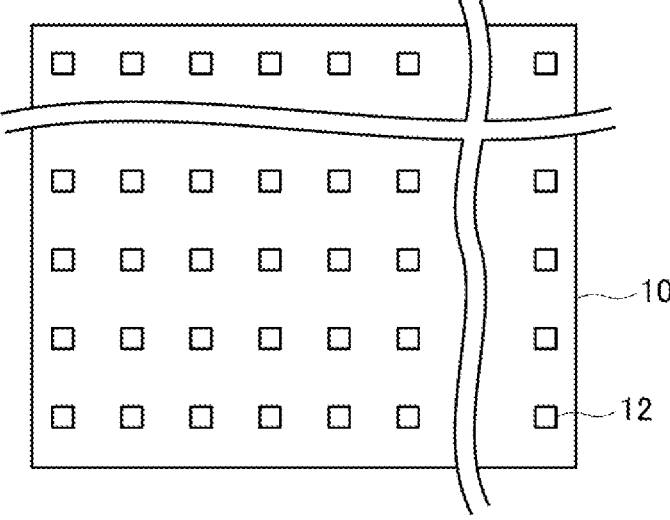
FIG. 2 is a schematic view of a shaping aperture array substrate.

As illustrated in FIG. 2, in the shaping aperture array substrate 10, openings (first openings) 12 are formed in m vertical rows×n horizontal columns (m, n≥2) with a predetermined arrangement pitch. The openings 12 are formed as rectangles having the same dimensional shape, for example. The shape of the openings 12 may be circular. A multi-beam 130M is formed by part of an electron beam 130 passing through this plurality of openings 12.

The BAA chip 30 is provided below the shaping aperture array substrate 10, and passage holes 32 (second openings, apertures) are formed corresponding to the arrangement positions of the openings 12 of the shaping aperture array substrate 10. In the vicinity of each passage hole 32 of the BAA chip 30, a blanker consisting of a set of two blanking electrodes 34 (see FIG. 3) as a pair is disposed. One of the blanking electrodes 34 is fixed to the ground potential, and the other is switched between the ground potential and another potential.

An electron beam passing through each passage hole 32 is independently deflected by a voltage applied to the blanker. In this manner, a plurality of blankers perform blanking deflection on corresponding beams of the multi-beam 130M which has passed through the plurality of openings 12 of the shaping aperture array substrate 10.

In the writing apparatus 100, an electron beam 130 emitted from the electron gun 111 (emitter) illuminates the shaping aperture array substrate 10 in its entirety substantially perpendicularly by the illumination lens 112. The electron beam 130 passes through the plurality of openings 12 of the shaping aperture array substrate 10, thereby forming a plurality of electron beams (multi-beam) 130M. The multi-beam 130M passes through between the blanking electrodes 34 of each of corresponding blankers of the BAA chip 30.

The multi-beam 130M which has passed through the BAA chip 30 is reduced by the reduction lens 115, and travels to a hole in the center of the limiting aperture member 116. Here, an electron beam deflected by a blanker of the BAA chip 30 is displaced from the hole in the center of the limiting aperture member 116, and blocked by the limiting aperture member 116. In contrast, an electron beam not deflected by a blanker passes through the hole in the center of the limiting aperture member 116. Blanking control is performed by ON/OFF of a blanker, and ON/OFF of the beam is controlled.

In this manner, the limiting aperture member 116 blocks those beams that are deflected by the plurality of blankers so as to achieve a beam-off state. The beam for one shot is formed by a beam which has passed through the limiting aperture member 116 during a time from beam ON to beam OFF.

The multi-beam which has passed through the limiting aperture member 116 is focused by the objective lens 117, and forms a pattern image with a desired reduction ratio. The entire multi-beam is collectively deflected by the deflector 118 in the same direction, and is radiated to respective irradiation positions of the beams on the sample 101. When the XY stage 105 is continuously moved, the irradiation positions of the beams are controlled by the deflector 118 so as to follow the movement of the XY stage 105.

The multi-beams radiated at one time are ideally arranged with the pitch which is the product of the arrangement pitch of the plurality of openings 12 of the shaping aperture array substrate 10 and the above-mentioned desired reduction ratio. The writing apparatus 100 performs a writing operation by a raster scan method for irradiating with a shot beam sequentially, and when a desired pattern is written, an unnecessary beam is controlled to be beam off by the blanking control.

Figure 4:
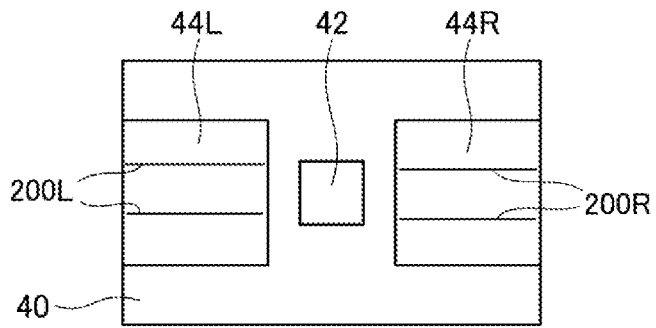
FIG. 4 is a plan view of a circuit plane.

A control signal for ON/OFF control of the beam is supplied to each blanker of the BAA chip 30 through a control circuit provided in the mounting substrate 40. For example, the mounting substrate 40 is rectangular, and as illustrated in FIG. 4, a control circuit 44L is provided in the area on one half side (the left side in FIG. 4) and a control circuit 44R is provided in the area on the other half side (the right side in FIG. 4) with the opening 42 (third opening) in the central portion interposed between both sides. The control circuits 44L, 44R are each a multi-layered circuit, and have stacked wiring layers and power-supply planes. FIG. 4 is a plan view of the wiring layers in the mounting substrate 40.

The control circuit 44L is provided with wires for transmitting a control signal to the blankers on the left half side of the BAA chip 30. The control circuit 44R is provided with wires for transmitting a control signal to the blankers on the right half side of the BAA chip 30. The control circuits supply control signals to blanker groups disposed in predetermined areas in the BAA chip 30, for example, division areas divided into the right and left.

The plan-view shape of a wire formation area and a power-supply plane of the control circuits 44L, 44R is preferably, for example, a simple shape such as a rectangle in order to prevent the occurrence of variation in beam position due to a magnetic field generated by the control circuits. In order to prevent the occurrence of variation in beam position due to a magnetic field generated by the control circuits 44L, 44R, wires 200L, 200R in the control circuits are preferably disposed so that the directions in which a current flows in outward and return are parallel as much as possible. Here, the "outward" corresponds to a current which flows through the wires 200L, 200R, and travels to the blanker groups of the BAA chip 30. For example, a current flows from the left end of the mounting substrate 40 toward the center through the wire 200L. The "return" corresponds to a return current which flows through the ground layer.

Figure 5:
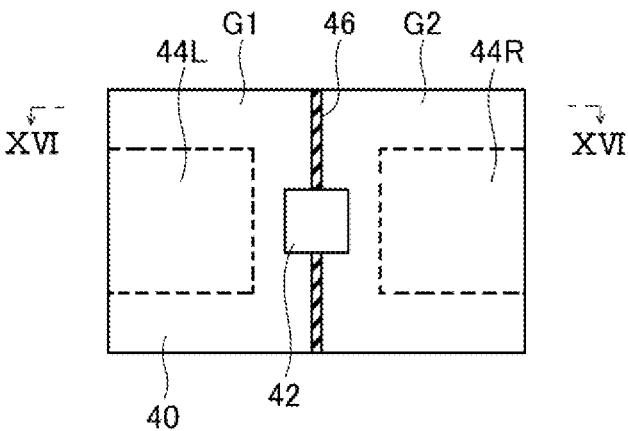
FIG. 5 is a plan view of the mounting substrate.

In this embodiment, a solid-shaped (plane-shaped) ground potential supply layer (hereinafter referred to as a ground or a ground layer) is electrically divided for each control circuit. For example, as illustrated in FIG. 5, the ground potential supply layer is electrically divided into ground G1 for the control circuit 44L and ground G2 for the control circuit 44 R. The ground G1 is disposed on one half side of the mounting substrate 40, and the ground G2 is disposed on the other half side of the mounting substrate 40.

Figure 16:
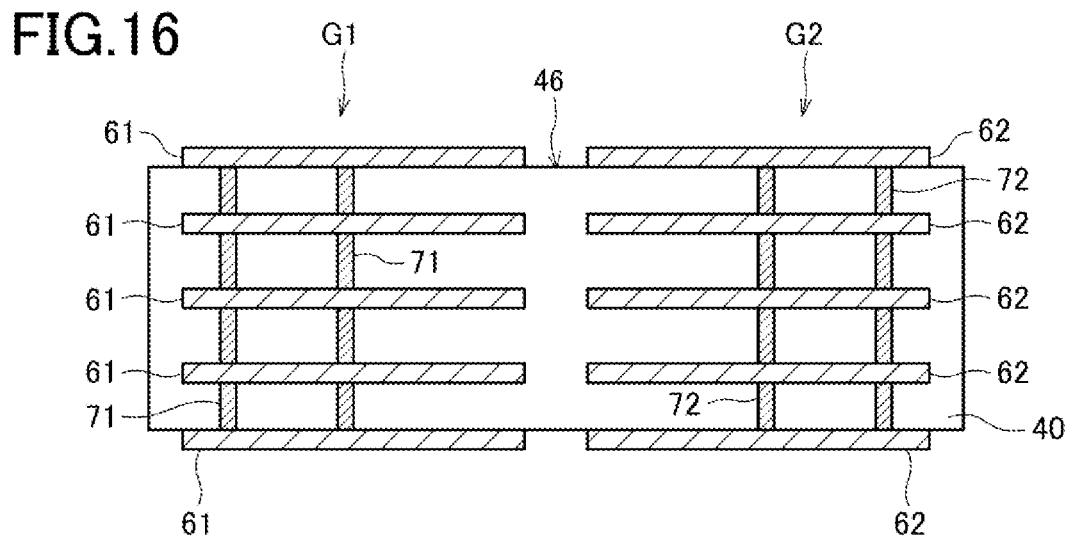
FIG. 16 is a cross-sectional view of the mounting substrate.

FIG. 16 is a cross-sectional view of the mounting substrate 40 along line XVI-XVI in FIG. 5. The ground G1 has a plurality of ground layers 61. The ground layers 61 are connected through vias 71. A circuit section (the wiring layers and power-supply planes mentioned above) constituting the control circuit 44L is provided between the ground layers 61. Similarly, the ground G2 has a plurality of ground layers 62. The ground layers 62 are connected through vias 72. A circuit section (the wiring layers and power-supply planes mentioned above) constituting the control circuit 44R is provided between the ground layers 62.

Of the ground layers 61, 62, the ones located on the surface layer of the mounting substrate 40 are formed by gold plating, for example. Electrical charge of the mounting substrate 40 by an electron beam can be prevented by applying gold plating to the substrate surface of the mounting substrate 40. Of the ground layers 61, 62, the ones located inside the mounting substrate 40 are composed of copper or tungsten, for example.

The ground G1 and the ground G2 are separated on the surface of the mounting substrate 40, and an insulation section 46 (composed of a mounting substrate material) where the surface of the mounting substrate 40 is exposed is provided between the ground G1 and the ground G2 so that the ground G1 and the ground G2 are electrically divided. Here, electrically divided may be expressed as electrically separated or electrically independent. In the embodiment below, "electrically divided" may be simply referred to as "divided". The mounting substrate 40 is composed of a publicly known insulating material such as FR4 and ceramic (Al$_2$O$_3$).

Even inside the mounting substrate 40, the ground layers 61 and the ground layers 62 are disposed spaced apart therefrom in a planar direction, and are electrically divided. For example, in the surface and the inside of the mounting substrate 40, the gap between the ends (the right ends in FIG. 16) of the ground layers 61 and the ends (the left ends in FIG. 16) of the ground layers 62 is approximately 0.05 mm to 30 mm.

Traditionally, an electrical signal is supplied from the right and left of the BAA chip to control an operation, and the mounting substrate is provided with two control circuits, and operated with the ground in common, the two control circuits being a control circuit to supply an electrical signal from the left side of the BAA chip and a control circuit to supply an electrical signal from the right side of the BAA chip. The current supplied from one of the control circuits to the BAA chip has complicated current paths, such as a path to return to a ground layer from the same control circuit and a path to return to a ground layer from the other control circuit, thus a distribution of complicated magnetic fields is generated.

Figure 19:
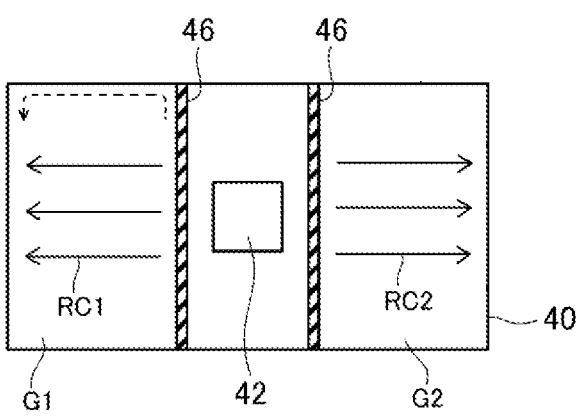
FIG. 19 is a conceptual view showing return currents.

However, as described above, a current in one control circuit can substantially be prevented from flowing through the other control circuit via the BAA chip 30 and the mounting substrate 40 by dividing the ground for each of the control circuits, and return currents RC1, RC2 as illustrated in FIG. 19 flow through the grounds G1, G2. Thus, the magnetic field generated by a current which flows through each control circuit is likely to be canceled by the magnetic field generated by a return current which flows through the ground corresponding to the control circuit, thus the effect of the magnetic field on the beam can be prevented.

Figure 6A:
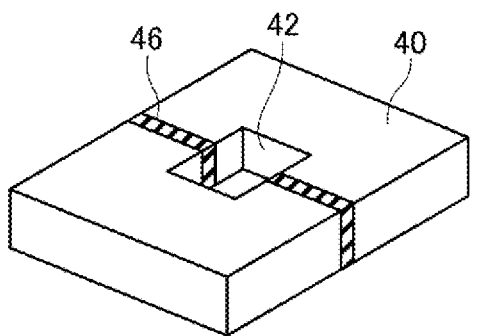
FIG. 6A and FIG. 6B are perspective views of the mounting substrate.

When the ground is divided by the insulation section 46 at the center of the mounting substrate 40, as illustrated in FIG. 6A, an end face of the insulation section 46 (the insulating material of the mounting substrate 40) is located in a lateral face of an opening 42. In this case, when a multi-beam passes through the opening 42, the insulation section 46 is charged with electricity, and abnormal deflection of the beam may occur.

Figure 6B:
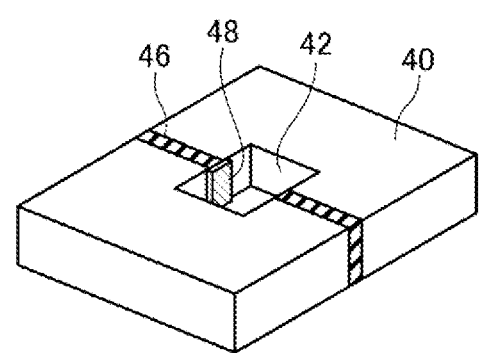

Thus, as illustrated in FIG. 6B, the insulation section 46 is preferably covered with a high resistance film 48. The high resistance film 48 prevents electrical charge as well as achieves division into the ground G1 and the ground G2, and has a higher resistance than the wire material of the control circuit and a lower resistance than the insulation section 46 (the material constituting the mounting substrate 40), and preferably has a resistance value around 50Ω or more and 1 MΩ or less, for example. The material for the high resistance film 48 is CrN, AlN, TiN, Pt, Ti.

Figure 7:
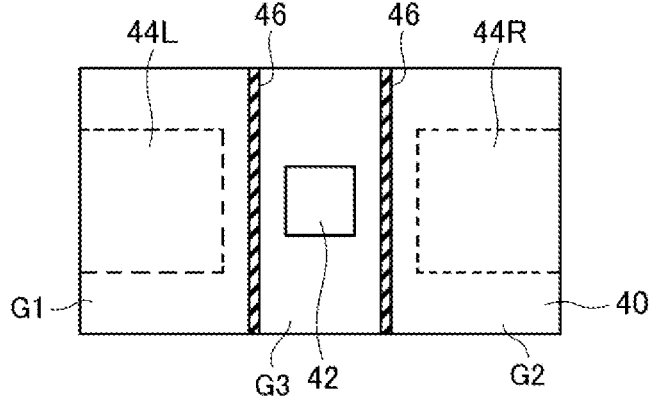
FIG. 7 is a plan view of the mounting substrate.

The ground may be divided into sections, the number of which is larger than the number of control circuits. FIG. 7 illustrates an example in which the ground is divided into three. The insulation section 46 (division pattern) in a linear form extending in a transverse direction of the mounting substrate 40 is provided between the control circuit 44L and the opening 42 and between the control circuit 44R and the opening 42 to divide the ground into three grounds G1 to G3 so that the ground is not in common between the control circuit 44L and the control circuit 44R. The ground G1 corresponds to the control circuit 44L, and the ground G2 corresponds to the control circuit 44R. In this configuration, an end face of the mounting substrate 40 is not exposed to the opening 42, and the high resistance film 48 illustrated in FIG. 6B is unnecessary.

In the configuration illustrated in FIG. 7, two insulation sections 46 are preferably located outside the area where the BAA chip 30 is installed. In other words, the BAA chip 30 is preferably installed in the area between the two insulation sections 46.

Figure 8:
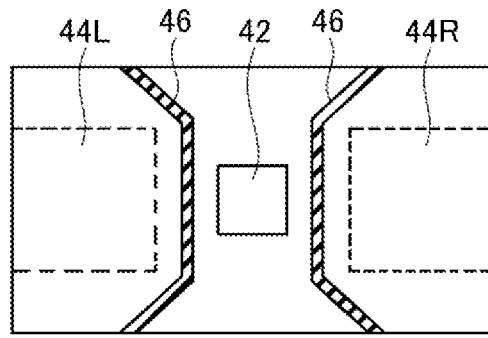
FIG. 8 is a plan view of the mounting substrate.
Figure 9:
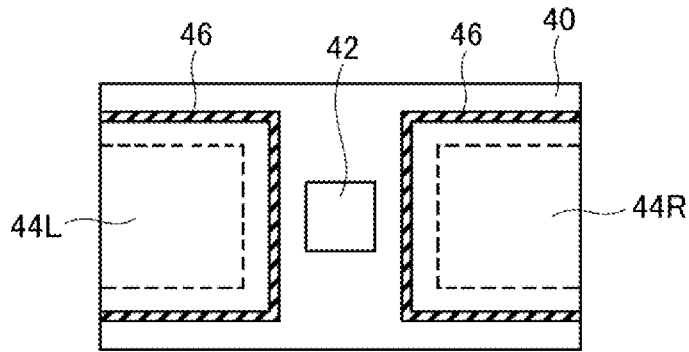
FIG. 9 is a plan view of the mounting substrate.

As illustrated in FIG. 8, FIG. 9, the insulation sections 46 may have a broken-line shape so as to be close to the control circuits 44L, 44R. When the insulation sections 46 are linear, return currents along the paths as illustrated by a dashed line in FIG. 19 may occur; however, the path of return currents can be made more parallel to the wire direction of a control circuit by forming a broken-line shape with the insulation sections 46, thus the effect of reducing the variation in beam position can be increased.

The number of control circuits is not limited to two, and may be three or more.

Figure 10:
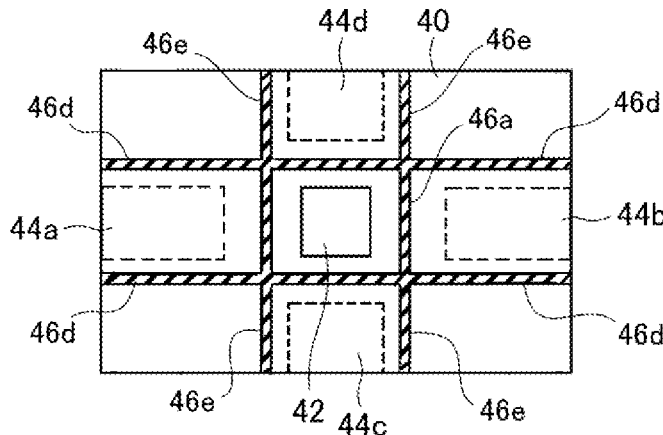
FIG. 10 is a plan view of the mounting substrate.

FIG. 10 illustrates an example in which the mounting substrate 40 is provided with four control circuits 44a to 44d. The control circuits 44a to 44d supply control signals to respective blanker groups in four division areas, into which the BAA chip 30 is divided.

The control circuits 44a to 44d are each provided between one side of the opening 42 and one of four sides of the outer peripheral edge of the mounting substrate 40, and are separated by the insulation sections so that the ground is not in common between the control circuits 44a to 44d. For example, the ground is separated by a rectangular frame-shaped insulation section 46a surrounding the opening 42, and insulation sections 46d, 46e which linearly extend from the corners of the insulation section 46a and are parallel to the four sides of the mounting substrate 40.

The insulation sections 46d extend in the left-right direction from the corners of the insulation section 46a. The insulation sections 46e extend in the up-down direction from the corners of the insulation section 46a.

The insulation sections 46*d* and the horizontal line portions of the insulation section 46*a* are located on the same straight line. The insulation sections 46*e* and the vertical line portions of the insulation section 46*a* are located on the same straight line.

In other words, the insulation sections are formed in a lattice pattern in FIG. 10, and the grounds correspond to the control circuits 44*a* to 44*d* are separated.

Figure 11:
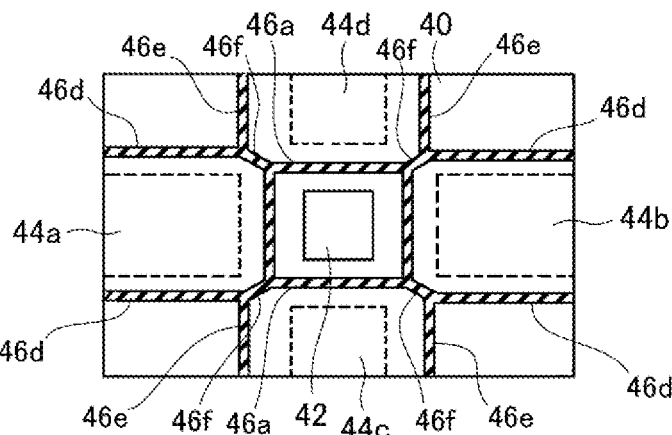
FIG. 11 is a plan view of the mounting substrate.

As illustrated in FIG. 11, when some control circuits (the control circuits 44*a*, 44*b*) have a larger size, and the insulation sections cannot be formed in a lattice pattern, insulation sections 46*f* extending in a diagonal direction toward the outer peripheral edge side from the four corners of the rectangular frame-shaped insulation section 46*a* may be formed.

One ends of the insulation sections 46*f* are connected to the corners of the insulation section 46*a*, and the insulation sections 46*d*, 46*e* extend from the other ends of the insulation sections 46*f* parallel to the sides in the left-right direction, and the sides in the up-down direction of the mounting substrate 40.

Figure 12:
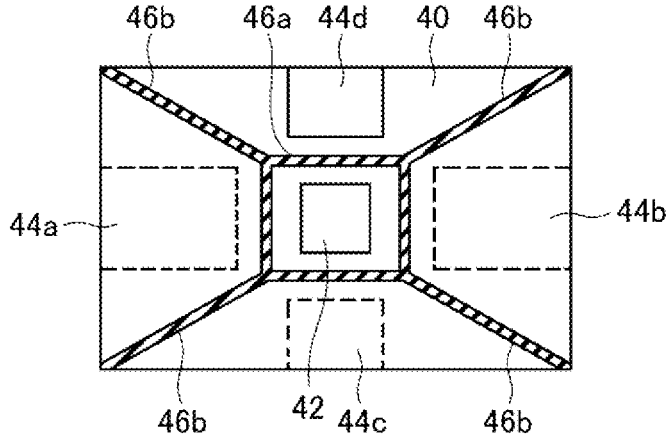
FIG. 12 is a plan view of the mounting substrate.

As illustrated in FIG. 12, a configuration may be adopted in which the ground is divided into five parts by a rectangular frame-shaped insulation section 46*a* surrounding the opening 42, and insulation sections 46*b* linearly extending in a diagonal direction from the corners of the insulation section 46*a* to the corners of the mounting substrate 40.

Figure 13:
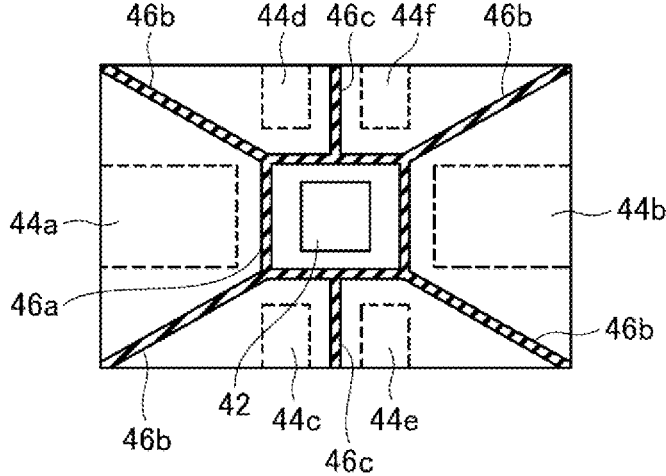
FIG. 13 is a plan view of the mounting substrate.

FIG. 13 illustrates an example in which the mounting substrate 40 is provided with six control circuits 44*a* to 44*f*. In this example, the configuration illustrated in FIG. 12 is further provided with insulation sections 46*c*. The insulation sections 46*b*, 46*c* radially extend from the frame-shaped insulation section 46*a* to the outer periphery of the mounting substrate 40.

In the configuration illustrated in FIG. 10 to FIG. 13, the plan-view shape of the mounting substrate 40 is rectangular, and multiple control circuits and insulation sections are disposed with a rotational symmetry of 180° about an axis passing through the center of the opening 42 and perpendicular to the major surface of the mounting substrate 40.

Figure 14A:
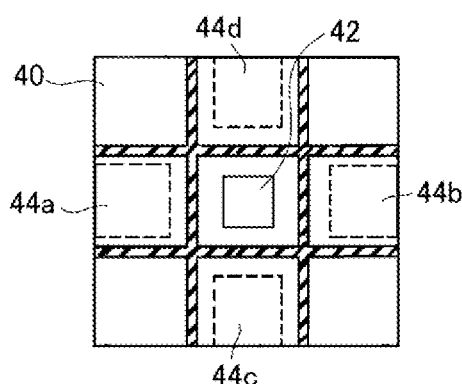
FIG. 14A and FIG. 14B are plan views of the mounting substrate.
Figure 14B:
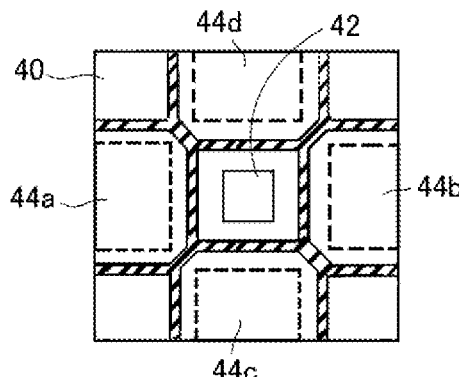

As illustrated in FIGS. 14A and 14B, when the plan-view shape of the mounting substrate 40 is square, the multiple control circuits and insulation sections may be disposed with a rotational symmetry of 90° about an axis passing through the center of the opening 42 and perpendicular to the major surface of the mounting substrate 40.

Even when the number of control circuits of the mounting substrate 40 is increased to 6, 8, 10 . . . , as in the configuration illustrated in FIG. 10 to FIGS. 14A and 14B, the mounting substrate 40 is preferably designed and manufactured by combining the rectangular frame-shaped insulation section surrounding the opening 42, the insulation sections extending parallel to the four sides of the peripheral edge of the mounting substrate 40, and the insulation sections extending in a diagonal direction.

Figure 15:
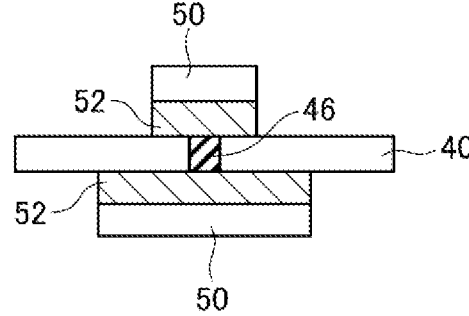
FIG. 15 is a view illustrating a method of attaching the mounting substrate.

In an electron beam writing apparatus, from the view point of stability of the electron beam, the ground is required to have the same potential as the electron column 102. Thus, the mounting substrate 40 is fixed to the electron column 102 using a metal fixing component, and the ground is electrically shorted to the electron column 102. However, as illustrated in FIG. 15, a high resistance plate 52 having a resistance value of around 50Ω to 1 MΩ is preferably provided between the mounting substrate 40 and fixing components 50 for the electron column 102 so that divided sections of the ground are not electrically connected. Consequently, each ground is connected to the electron column

102 with a certain resistance value. In addition, with the high resistance plate 52 interposed, a common ground is prevented from being formed by electrical connection of divided sections of the ground.

As the material for the high resistance plate 52, for example, a plate made of SiN or AlN, or a Ti plate on which an AlN film is formed can be used.

In this manner, according to this embodiment, a current from one control circuit is substantially prevented from flowing to other control circuits through the BAA chip and the mounting substrate by providing divided grounds corresponding to multiple control circuits on the mounting substrate 40. As a result, the magnetic field generated by a current which flows through each control circuit can be cancelled by the magnetic field generated by a return current which flows through a corresponding ground, thus the effect on the electron beam can be reduced.

In the aforementioned embodiment, a configuration has been described in which the multi-beam 130M is formed by part of the electron beam 130 passing through the plurality of openings 12 of the shaping aperture array substrate 10; however, the method of forming a multi-beam is not limited to this, and for example, a plurality of emitters to emit an electron beam may be provided.

In the aforementioned embodiment, a multi beam writing apparatus has been described as an example of an apparatus on which the blanking aperture array system having the BAA chip and the mounting substrate is installed, however, the apparatus is not limited to this. The blanking aperture array system can be similarly installed, for example, on an apparatus that irradiates with a multi-beam, such as an inspection apparatus that inspects a defect of a pattern.

Figure 17:
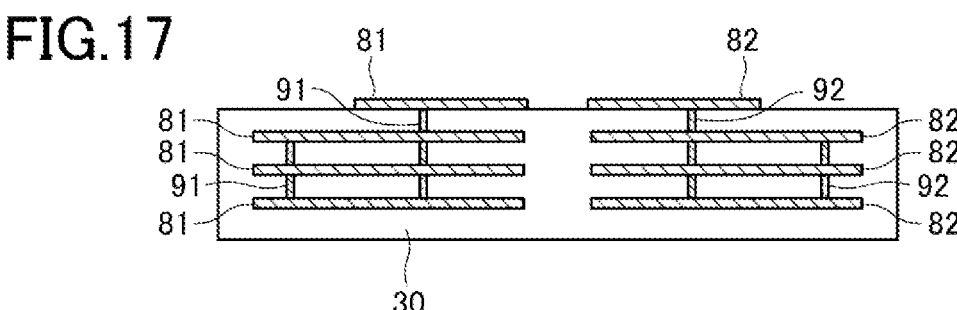
FIG. 17 is a cross-sectional view of a blanking aperture array chip.

In the aforementioned embodiment, an example has been described in which the ground of the mounting substrate 40 is divided; however, the ground of the BAA chip 30 may be further divided. For example, as illustrated in FIG. 17, a plurality of ground layers 81 are provided on one half side of the BAA chip 30 comprised of a silicon substrate, and a plurality of ground layers 82 are provided on the other half side. The ground layers 81 are connected through vias 91. In addition, the ground layers 82 are connected through vias 92.

Of the plurality of ground layers 81, 82, the surface ground layers are for the blanking electrodes 34. A power supply layer is provided between the ground layers 81, between the ground layers 82.

The ground layers 81 and the ground layers 82 are disposed spaced apart therefrom, and are electrically divided. For example, the ground layers 81 are for the control circuits of the blankers on the left half side of the BAA chip 30, and the ground layers 82 are for the control circuits of the blankers on the right half side of the BAA chip 30.

The ground layers 81 and the ground layers 82 are connected to different grounds of the mounting substrate 40. For example, the ground layers 81 are connected to ground G1 of the mounting substrate 40, and the ground layers 82 are connected to ground G2 of the mounting substrate 40.

Figure 18:
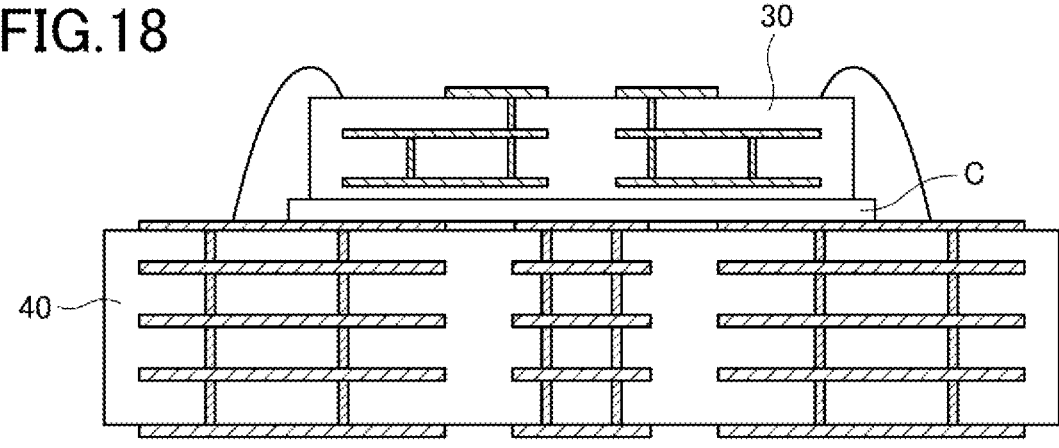
FIG. 18 is a cross-sectional view of a blanking aperture array system.

The number of divided grounds of the BAA chip 30 and the number of divided grounds of the mounting substrate 40 may be the same or may be different. FIG. 18 illustrates an example in which the BAA chip 30 with two divided grounds is installed on the mounting substrate 40 with three divided grounds with a chip carrier C interposed therebetween.

The lower surface of the chip carrier C and the upper surface of the mounting substrate 40 are fixed by adhesion using a conductive adhesive agent, or sintering bonding using Ag nanoparticles. In order to prevent electrical conduction between the divided grounds of the mounting substrate 40, a conductive adhesive agent is preferably applied not across a ground divider (a section that separates the ground) of the mounting substrate 40.

The ground of the mounting substrate 40 may not be divided, and the ground of the BAA chip 30 may be divided.

Figure 20:
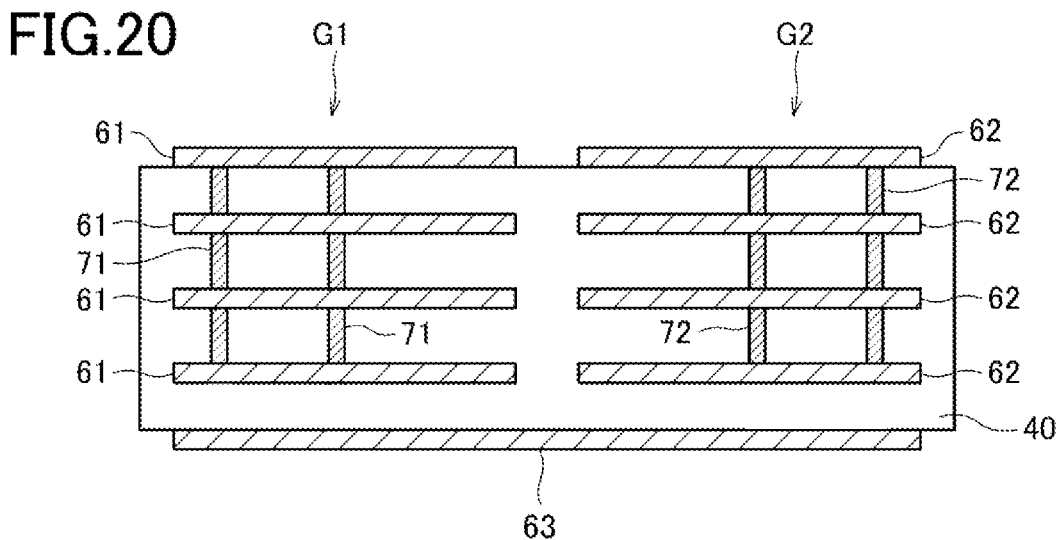
FIG. 20 is a cross-sectional view of the mounting substrate.

As illustrated in FIG. 20, the ground layers 61 of the ground G1 and the ground layers 62 of the ground G2 may be disposed spaced apart therefrom on the upper surface of the mounting substrate 40 and inside the mounting substrate 40, and a ground layer 63 not via-connected to (independent from) the ground layers 61, 62 may be provided on the lower surface of the mounting substrate 40.

By using such a configuration, a high resistance plate 52 can be omitted between the fixing component 50 (see FIG. 15) and the ground layer 63.

Figure 21:
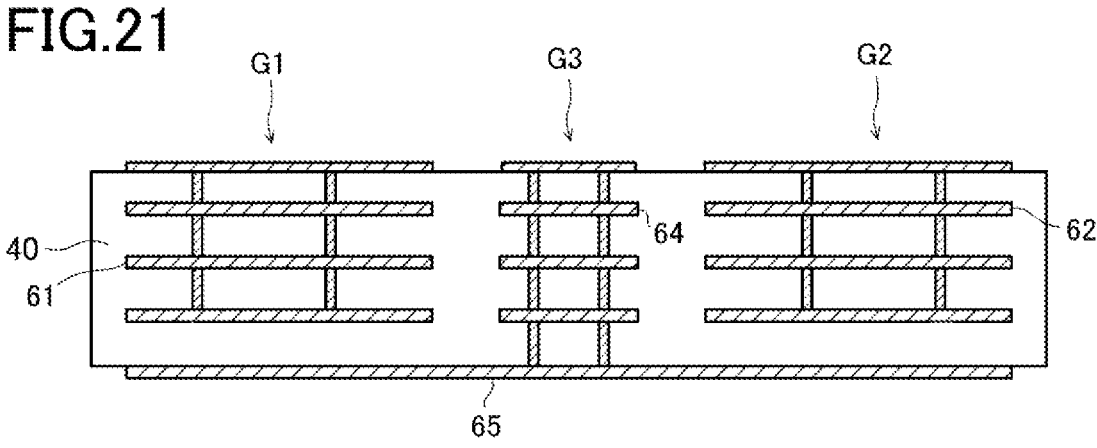
FIG. 21 is a cross-sectional view of the mounting substrate.

As illustrated in FIG. 21, even when the ground is divided into three grounds G1 to G3, and the ground G1, the ground G2 on the left and right correspond to respective control circuits 44L, 44R (see FIG. 7), a ground layer 65 not via-connected to the ground layers 61, 62 of the grounds G1, G2 may be provided on the lower surface of the mounting substrate 40. Ground layers 64 of the ground G3 are via-connected to the ground layer 65. It can be explained that the ground layer 65 is one of the plurality of ground layers 64 constituting the ground G3, the one being disposed on the lower surface of the mounting substrate 40. The ground layer 65 is provided on substantially the entire lower surface of the mounting substrate 40, and extends to a region below the ground layers 61, 62 of the grounds G1, G2.

The high resistance plate 52 provided on the lower and upper surface of the mounting substrate 40 (see FIG. 15) can be omitted because the ground 64 and 65 are completely separated from the ground of control circuit of the mounting substrate.

Figure 22:
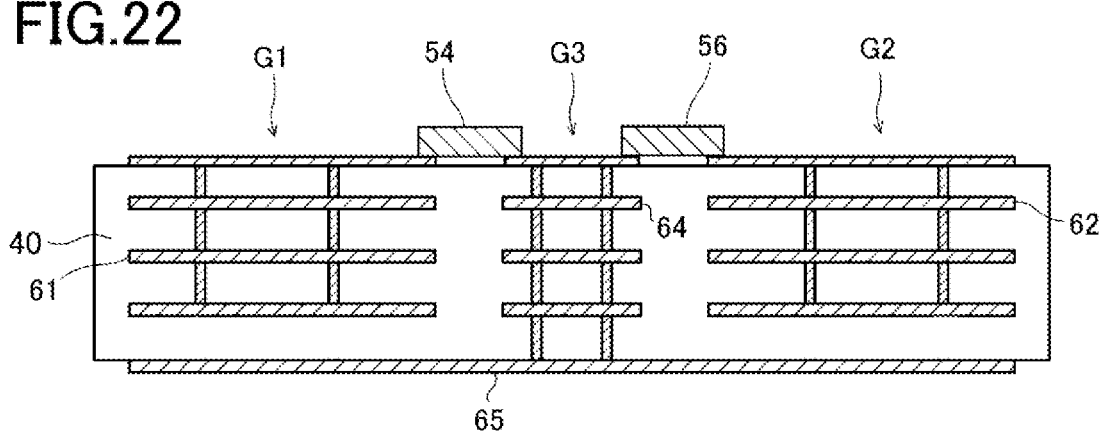
FIG. 22 is a cross-sectional view of the mounting substrate.

As illustrated in FIG. 22, a resistance component 54 to connect the ground G1 and the ground G3 and a resistance component 56 to connect the ground G2 and the ground G3 may be disposed on the upper surface of the mounting substrate 40. The resistance components 54, 56 are disposed across an insulation section between the grounds. The resistance components 54, 56 have a resistance value of around 200Ω to 1 MΩ. A plurality of resistance components 54, 56 may be disposed.

Figure 23:
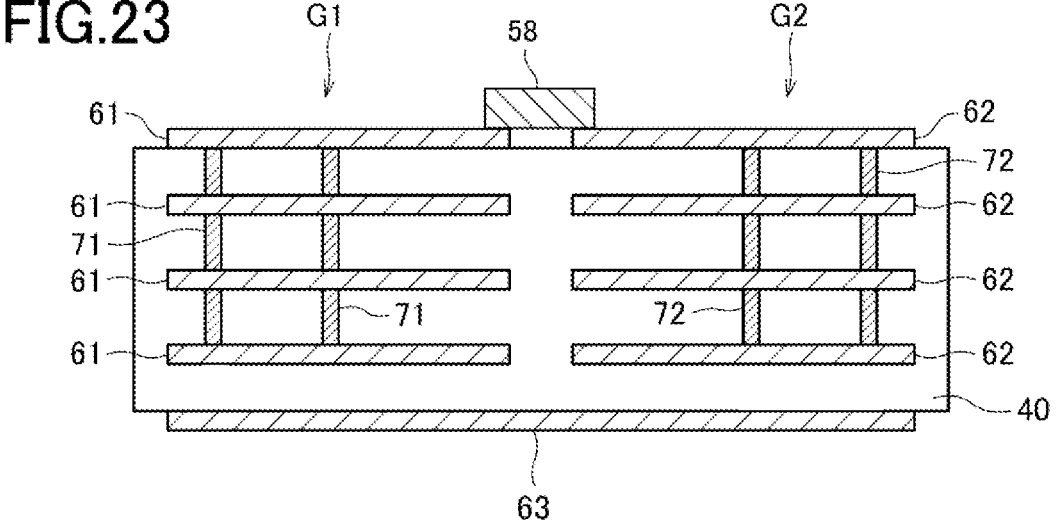
FIG. 23 is a cross-sectional view of the mounting substrate.

For the mounting substrate with two divided grounds illustrated in FIG. 20, a resistance component to connect the grounds may also be disposed. For example, as illustrated in FIG. 23, a resistance component 58 to connect the ground G1 and the ground G2 may be disposed across an insulation section between the grounds on the upper surface of the mounting substrate 40. The resistance component 58 has a resistance value of around 200Ω to 1 MΩ. A plurality of resistance components 58 may be disposed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A mounting substrate which is to be installed on a multi charged particle beam irradiation apparatus, and on which a blanking aperture array chip provided with a plurality of blankers to perform blanking deflection on beams in a multi charged particle beam is mounted, the mounting substrate comprising:

an opening through which the multi charged particle beam passes;

a plurality of control circuits, each of which supplies a control signal to the blankers provided in each of a plurality of areas into which the blanking aperture array chip is divided; and grounds, each of which is provided for a corresponding one of the plurality of control circuits and configured to supply a ground electrical potential to the corresponding control circuit, wherein the grounds corresponding to the control circuits are electrically separated from each other.

2. The mounting substrate according to claim 1, wherein the grounds corresponding to the plurality of control circuits are disposed spaced apart from each other on a surface of the mounting substrate, and a section by which the grounds are spaced apart is an insulation section where the surface of the mounting substrate is exposed.

3. The mounting substrate according to claim 2, wherein the plurality of control circuits and the insulation section are disposed with a rotational symmetry of 90° or 180° about an axis passing through a center of the opening and perpendicular to a major surface of the mounting substrate.

4. The mounting substrate according to claim 2, wherein the insulation section includes:

a frame-shaped first insulation section that surrounds the opening; and a plurality of linear second insulation sections that radially extend from the first insulation section toward an outer periphery of the mounting substrate.

5. The mounting substrate according to claim 2, wherein the insulation section includes a lattice pattern.

6. The mounting substrate according to claim 1, wherein the plurality of control circuits include wires disposed parallel to directions of return currents which flow through the grounds.

7. The mounting substrate according to claim 1, wherein a first control circuit and a second control circuit are provided as the plurality of control circuits, a ground for the first control circuit and a ground for the second control circuit are electrically separated by an insulation section where a substrate surface is exposed, and A lateral face of the opening is provided with a high resistance film of 50Ω to 1 MΩ, which covers an end face of the insulation section.

8. The mounting substrate according to claim 1, wherein a first control circuit and a second control circuit are provided as the plurality of control circuits, a first ground corresponding to the first control circuit, and a second ground corresponding to the second control circuit are electrically separated, the first ground includes a plurality of first ground layers which are stacked, and the plurality of first ground layers are connected through a first via, the second ground includes a plurality of second ground layers which are stacked, and the plurality of second ground layers are connected through a second via, and the plurality of first ground layers and the plurality of second ground layers are disposed spaced apart.

9. The mounting substrate according to claim 8, wherein one surface of the mounting substrate is provided with a third ground layer that is electrically separated from the first ground and the second ground.

10. The mounting substrate according to claim 9, wherein another surface of the mounting substrate is provided with a resistance component that connects the first ground layer and the second ground layer.

11. The mounting substrate according to claim 8, wherein a third ground is provided between the first ground and the second ground, the third ground being electrically separated from the first ground and the second ground, and the third ground includes a plurality of third ground layers which are stacked, and the plurality of third ground layers are connected through a third via.

12. The mounting substrate according to claim 11, wherein one surface of the mounting substrate is provided with one of the third ground layers between one the first ground layers and one of the second ground layers, and another surface of the mounting substrate is provided with one of the third ground layers and not provided with the first ground layers and the second ground layers.

13. A mounting substrate which is to be installed on a multi charged particle beam irradiation apparatus, and on which a blanking aperture array chip provided with blanking electrodes to perform blanking deflection on beams in a multi charged particle beam is mounted, the mounting substrate comprising:
  an opening through which the multi charged particle beam passes;
  a plurality of control circuits a control signal to the blanking electrodes for each of a plurality of areas into which the blanking aperture array chip is divided; and
  grounds, each of which is provided for a corresponding one of the plurality of control circuits and configured to supply a ground electrical potential to the corresponding control circuit, wherein
  a first control circuit and a second control circuit are provided as the plurality of control circuits,
  a first ground corresponding to the first control circuit includes a plurality of first ground layers which are stacked, and the plurality of first ground layers are connected through a first via,
  a second ground corresponding to the second control circuit includes a plurality of second ground layers which are stacked, and the plurality of second ground layers are connected through a second via,
  the plurality of first ground layers and the plurality of second ground layers are disposed spaced apart,
  a third ground is provided between the first ground and the second ground,
  the third ground includes a plurality of third ground layers which are stacked, and the plurality of third ground layers are connected through a third via,
  one surface of the mounting substrate is provided with one of the third ground layers between one the first ground layers and one of the second ground layers,
  another surface of the mounting substrate is provided with one of the third ground layers and not provided with the first ground layers and the second ground layers, and
  the one surface of the mounting substrate is provided with a first resistance component to connect one of the first ground layers and one of the third ground layers, and a second resistance component to connect one of the second ground layers and the one of the third ground layers.

14. The mounting substrate according to claim 8, wherein a circuit section that constitutes the first control circuit is provided between the plurality of first ground layers, and a circuit section that constitutes the second control circuit is provided between the plurality of second ground layers.

15. A blanking aperture array chip to be installed on a multi charged particle beam irradiation apparatus, the blanking aperture array chip comprising:
  a plurality of blankers provided for respective apertures through which beams in a multi charged particle beam pass, and configured to perform blanking deflection on the beams;
  a plurality of control circuits, each of which supplies a control signal to the blankers provided in each of a plurality of areas into which the blanking aperture array chip is divided; and
  a plurality of grounds, each of which is provided for a corresponding one of the plurality of control circuits and configured to supply a ground electrical potential to the corresponding control circuit,
  wherein the grounds corresponding to the control circuits are electrically separated from each other.

16. A blanking aperture array system to be installed on a multi charged particle beam irradiation apparatus, the blanking aperture array system comprising:
  a blanking aperture array chip provided with a plurality of blankers to perform blanking deflection for respective apertures through which beams in a multi charged particle beam pass; and
  a mounting substrate on which the blanking aperture array chip is mounted, the mounting substrate being provided with openings through which the multi charged particle beam passes,
  wherein the blanking aperture array chip and the mounting substrate are each provided with a plurality of control circuits a control signal to the blankers, and
  in each of the blanking aperture array chip and the mounting substrate, grounds corresponding to the control circuits are electrically separated from each other.

17. The blanking aperture array system according to claim 16, wherein the blanking aperture array chip is installed on the mounting substrate through a chip carrier, a lower surface of the chip carrier and an upper surface of the mounting substrate are bonded by a conductive adhesive agent, and the conductive adhesive agent is applied not across a section that separates the grounds of the mounting substrate.

18. A multi charged particle beam irradiation apparatus comprising:
  a beam formation mechanism forming a multi charged particle beam;
  a blanking aperture array chip provided with blanking electrodes to perform blanking deflection for respective apertures through which beams in the multi charged particle beam pass; and
  the mounting substrate according to claim 1, on which the blanking aperture array chip is mounted.

19. The multi charged particle beam irradiation apparatus according to claim 18, wherein the beam formation mechanism, the blanking aperture array chip and the mounting substrate are disposed in an electron column, the mounting substrate is mounted on the electron column by a fixing component made of metal, and a high resistance plate of 50Ω to 1 MΩ is provided between the mounting substrate and the fixing component.

* * * * *